United States Patent [19]
Gross et al.

[11] Patent Number: 4,878,034
[45] Date of Patent: Oct. 31, 1989

[54] DIGITAL PROTECTION CIRCUIT AND METHOD FOR LINEAR AMPLIFIER

[75] Inventors: William H. Gross, Sunnyvale; James B. Cecil, Santa Clara, both of Calif.

[73] Assignee: Elantec, Milpitas, Calif.

[21] Appl. No.: 329,377

[22] Filed: Mar. 27, 1989

[51] Int. Cl.⁴ .............................................. H03F 1/52
[52] U.S. Cl. .............................. 330/298; 330/207 P; 361/75; 361/93; 361/98
[58] Field of Search .............. 330/207 P, 298; 361/74, 361/75, 86, 93, 98, 100, 101

[56] References Cited

U.S. PATENT DOCUMENTS 4,481,553 11/1984 Owen et al. ................... 330/288 X Primary Examiner—James B. Mullins
Attorney, Agent, or Firm—A. C. Smith

[57] ABSTRACT

An overload protection circuit for a disableable amplifier includes a sensing resistor connected to provide indication of the current supplied to the amplifier and includes logic circuitry for producing a disabling control signal for a selected time interval following detection of the overload condition of the amplifier.

3 Claims, 3 Drawing Sheets

DIGITAL PROTECTION CIRCUIT AND METHOD FOR LINEAR AMPLIFIER

FIELD OF THE INVENTION

This invention relates to overload protection circuits for linear amplifiers using digital logic to disable the linear amplifier during overloaded operating conditions.

SUMMARY OF THE INVENTION

The present invention uses digital logic elements to protect a direct-coupled amplifier circuit from short-circuit or overload operating conditions by activating an enable circuit within the amplifier in response to the logic output of a comparator that senses current supplied to the amplifier. A timing circuit in the logic periodically determines whether the amplifier should remain disabled to avoid dissipating excessive power during continuing overload or short circuit operating conditions.

DESCRIPTION OF THE PREFERRED EMBODIMENT

Figure 1:
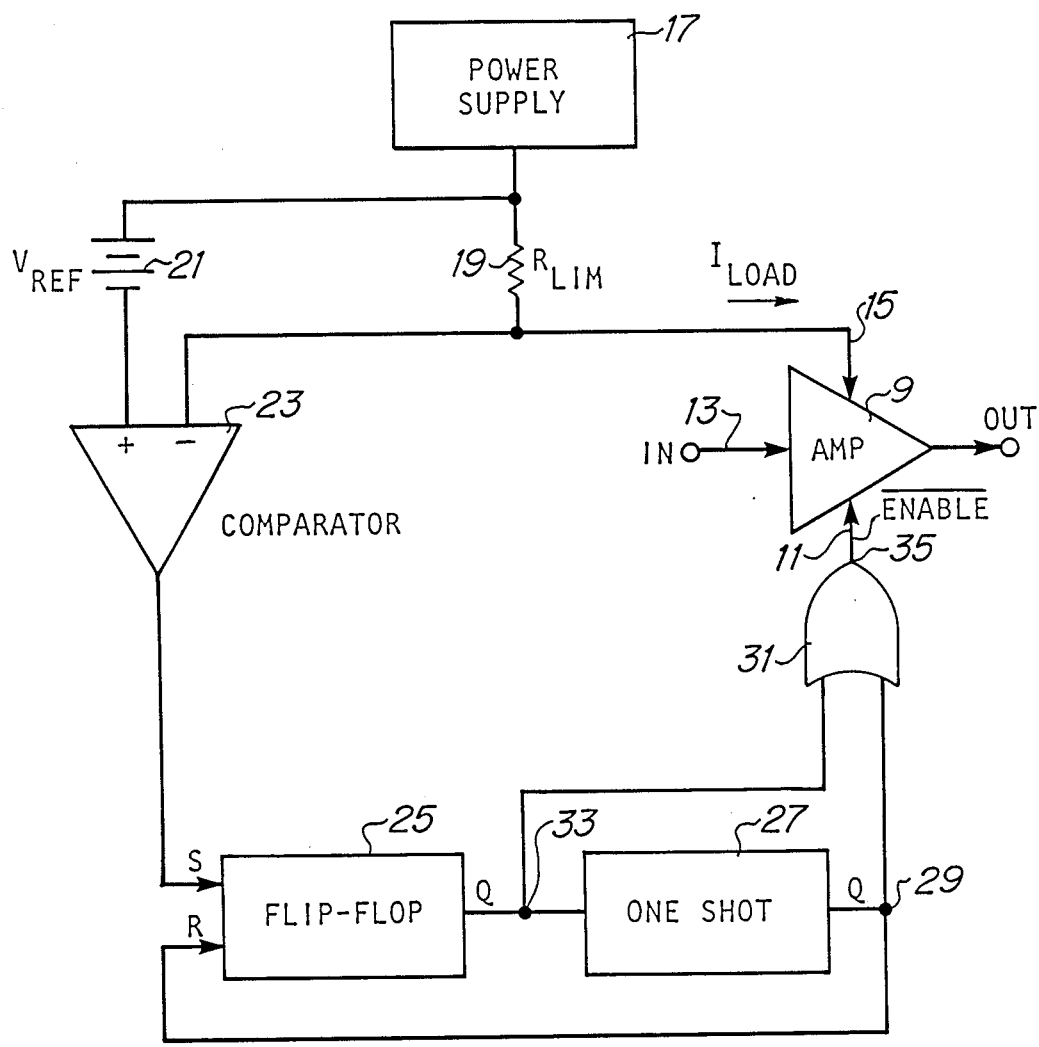
FIG. 1 is a block schematic diagram of one embodiment of the present invention.

Referring now to the block schematic diagram of FIG. 1, there is shown an amplifier that is to be protected against overload or short circuit operation, and that includes an enable signal input 11 in addition to its signal input 13. Direct-coupled amplifiers of this type are commercially available (e.g. type EL2007 and EL2020, manufactured by Elantec of Milpitas, Calif.), and include a bias connection 15 for supplying operating power thereto.

In accordance with the present invention, current is supplied to the amplifier 9 from power supply 17 through resistor 19 and the voltage drop thereacross (attributable to the biasing and load currents in amplifier 9) is compared with the reference voltage 21 in comparator 23. For normal operation of amplifier 9, the current through resistor 19 does not produce a voltage drop thereacross in excess of the reference voltage. However, under short circuit or overload operating conditions of amplifier 9, the voltage drop across resistor 19 exceeds the reference voltage and comparator 23 produces a representative output that is applied to set the flip-flop circuit 25 which, in turn, triggers a monostable or 'one-shot' circuit 27. The one-shot circuit produces an output indicative of its operation in its time-out mode, and the output 29 is applied to the reset input of flip-flop circuit 25 to reset it. The OR gate 31 is connected to receive the output 33 of the flip flop circuit 25 and the output 29 of the one-shot circuit 27 to produce a disable (enable) signal at the output 35 either when the flip-flop circuit 25 is set or the one-shot circuit is timing out, which disable signal thus disables amplifier 9 for the duration of the time-out operation of the one-shot circuit 27. If the overload or short-circuit operating condition is relieved by the end of the time-out operation of the one-shot circuit 27, the amplifier 9 will be enabled by the signal (or removal of signal, depending on logic convention) on line 11. Current flowing to the amplifier 9 again produces a voltage drop across resistor 19 that is less than the reference voltage 21, and comparator 23 therefore does not set the flip-flop circuit 25, and the amplifier 9 continues to operate normally.

However, if the current that flows through resistor 19 to the amplifier 9 is again high (attributable to overload or short-circuit operation), then the voltage drop across the resistor 19 again exceeds the reference voltage as sensed by the comparator 23 which again sets the flip-flop circuit 25 that, in turn, triggers the one-shot circuit 27 for time-out operation, as previously described, during which amplifier 9 is disabled. The logic circuit therefore continuously triggers and resets for as long as the amplifier 9 remains in the overload or short-circuit operation. The recurring, brief intervals of enabled operation of amplifier 9 at the end of each time-out operation of the one-shot circuit 27 causes only negligible average power dissipation in amplifier 9 because the logic action rapidly disables the amplifier 9 at the end of each time-out operation during continuation of the overload or short-circuit operating condition.

Figure 2:
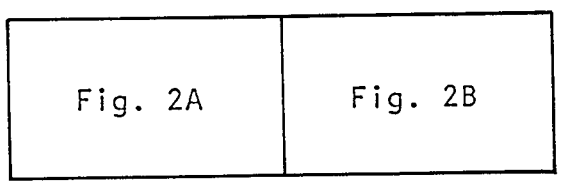
FIGS. 2, 2A and 2B are a detailed schematic of the logic circuitry according to the present invention.
Figure 2A:
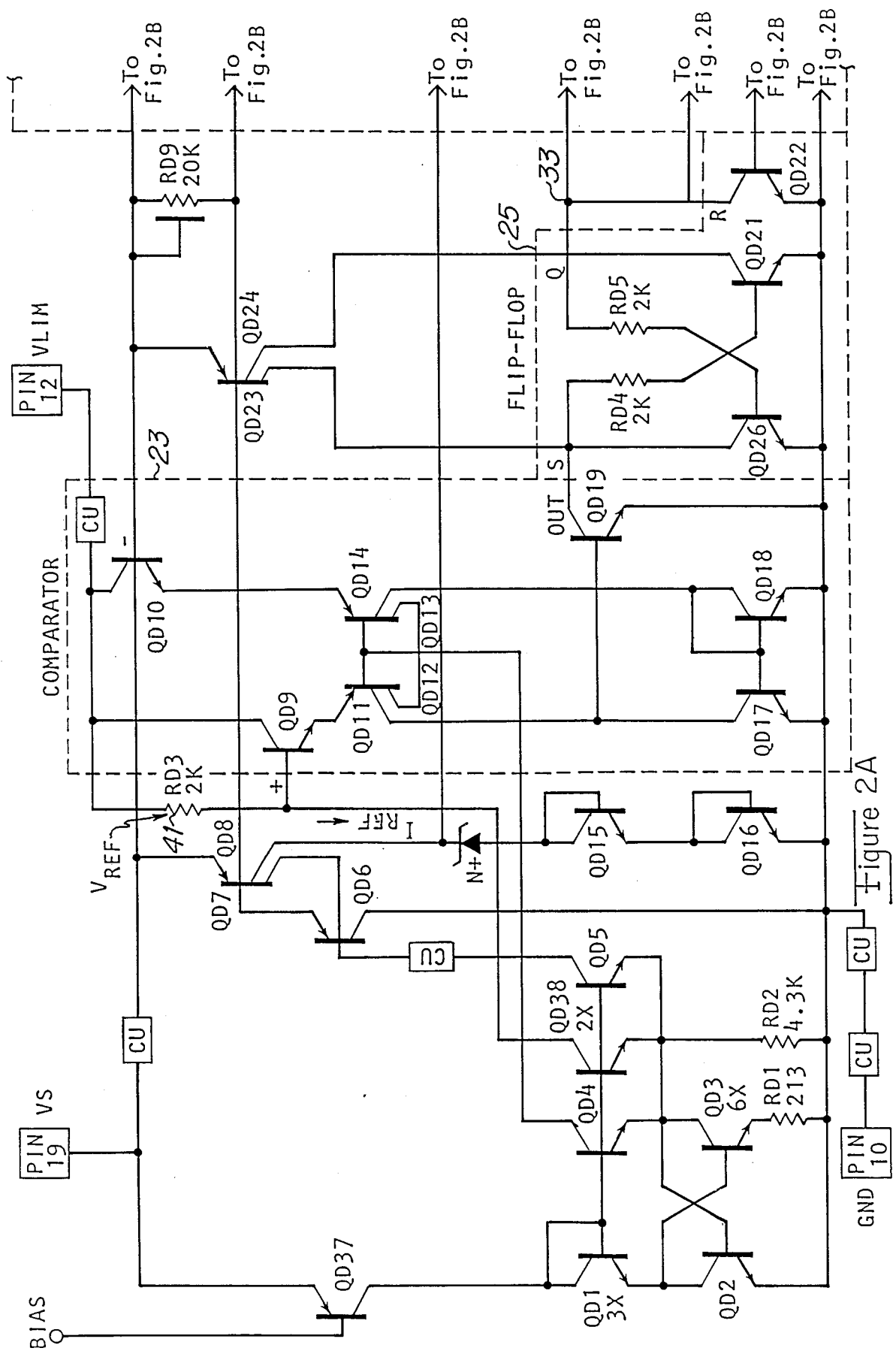
Figure 2B:
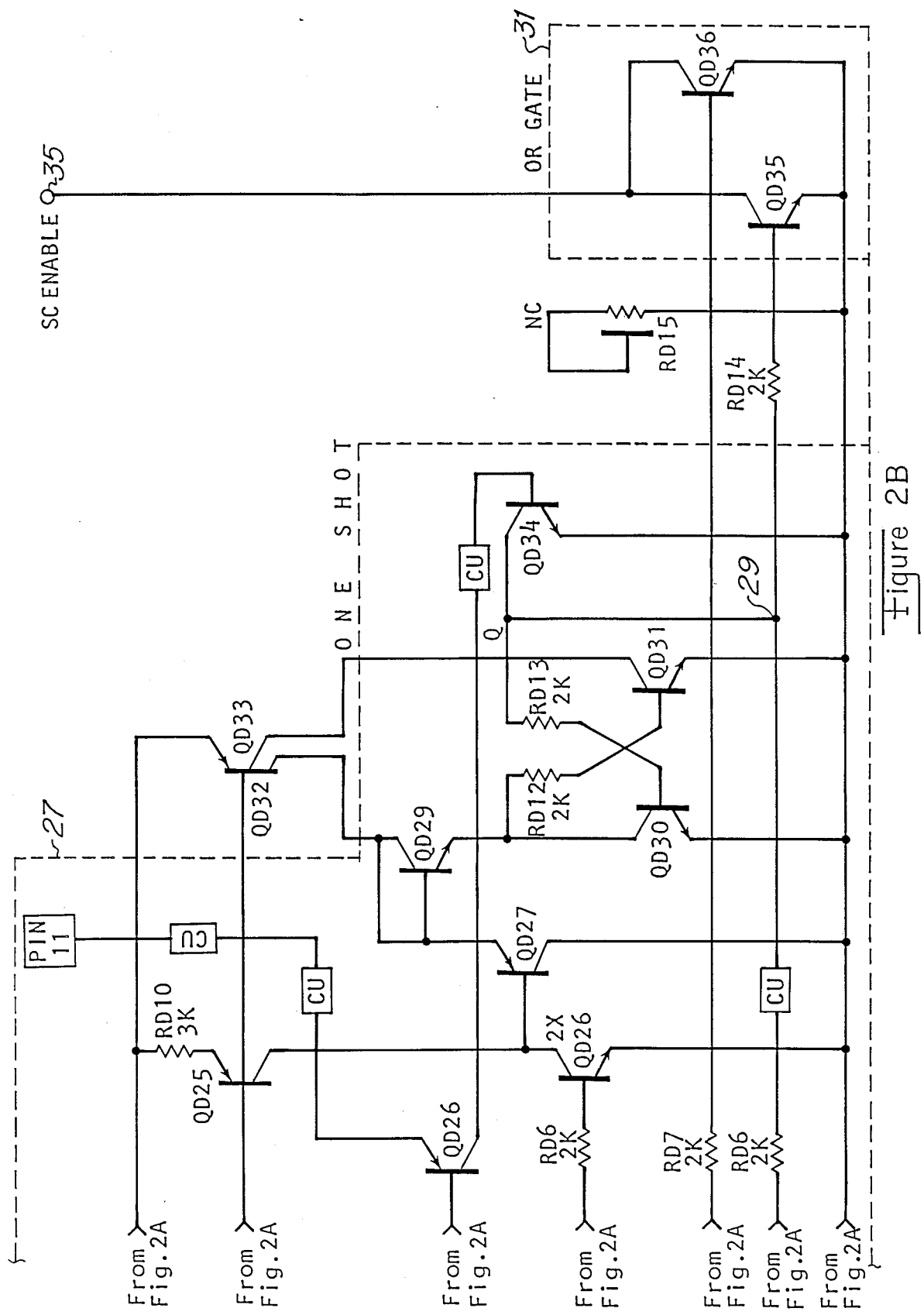

Referring now to FIGS. 2A and 2B, there is shown a schematic diagram of one embodiment of the logic circuit according to the present invention for providing an enable control signal on output 35 of the OR gate in response to current supplied to an amplifier 9 (not shown) through a sensing resistor 19 (not shown). The comparator 23 receives the voltage drop across such sensing resistor at pin pads 12 and 19 of the integrated circuit of FIG. 2A for comparison with the reference voltage produced across resistor 41 to set the flip-flop circuit 25 when the sensed voltage exceeds the reference voltage across resistor 41. The flip-flop circuit 25 triggers the one-shot circuit 27 to initiate time-out operation and to produce the output 29 that also resets the flip-flop circuit 25. The OR gate 31 thus receives the output 33 of the flip-flop circuit 25 and the output 29 of the one-shot circuit to produce the disable-control signal 35 when either the flip-flop circuit is set or the one-shot circuit 27 is timing out. With the amplifier disabled under overload or short circuit operating conditions, the amplifier is protected from dissipating excessive power.

In accordance with the present invention, no significant hysteresis is involved in disabling the amplifier upon occurence of an overload condition. The resetting of the disable control signal is determined by the time out operation of the one-shot circuit which may be conveniently set or designed as manufactured for a selected reset interval, after which the amplifier is again enabled. If overload conditions persist, the amplifier will again be rapidly disabled for the time-out interval determined by the one-shot circuit 27.

What is claimed is:

1. A circuit for controlling operation of an amplifier which receives operating current and which has a control input for disabling the amplification of an applied signal in response to a signal applied to the control input thereof, the circuit comprising: p1 resistor means connected to supply operating current to the amplifier for producing a voltage drop thereacross representative of the operating current supplied thereto;

comparator means coupled to receive said voltage drop for producing an output in response to said voltage drop exceeding a selected level;

trigger means coupled to receive the output from said comparator means for operating in response thereto in one of two logic states, said trigger means including an input for receiving an input applied thereto to activate operation thereof in another of said two logic states;

timing means operable for a selected time interval in response to a signal applied thereto, said timing means being coupled to said trigger means and producing an output indicative of operation thereof for said time interval in response to said trigger means operating in said one logic state;

means coupling the output of said timing means to said input of said trigger means to activate operation thereof in said other logic state; and gating means coupled to said trigger means and to said timing means for producing the signal for application to the control input to disable the amplifier in response to said trigger means operating in said one logic state or said timing means operating in said timing interval.

2. A circuit as in claim 1 wherein:

said comparator means includes means producing a source of reference voltage that establishes said selected level.

3. A circuit as in claim 1 wherein:

said timing means includes a monostable circuit having an astable timing state and a stable state, and said gating means includes an OR-logic circuit for producing said signal to disable the amplifier in response to the timing means operating in the astable state or the trigger means operating in said one logic state.

* * * * *